US010423073B2

(12) United States Patent
Enkisch et al.

(10) Patent No.: US 10,423,073 B2
(45) Date of Patent: Sep. 24, 2019

(54) METHOD FOR PRODUCING A MIRROR ELEMENT

(71) Applicant: Carl Zeiss SMT GmbH, Oberkochen (DE)

(72) Inventors: Hartmut Enkisch, Aalen (DE); Peter Huber, Heidenheim (DE); Sebastian Strobel, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 293 days.

(21) Appl. No.: 15/225,328

(22) Filed: Aug. 1, 2016

(65) Prior Publication Data

US 2016/0342093 A1 Nov. 24, 2016

Related U.S. Application Data

(63) Continuation of application No. PCT/EP2015/051791, filed on Jan. 29, 2015.

(30) Foreign Application Priority Data

Jan. 30, 2014 (DE) .................... 10 2014 201 622

(51) Int. Cl.
*G02B 5/10* (2006.01)
*G03F 7/20* (2006.01)
(Continued)

(52) U.S. Cl.
CPC ........... *G03F 7/702* (2013.01); *G02B 5/0816* (2013.01); *G02B 5/0891* (2013.01); *G02B 5/09* (2013.01);
(Continued)

(58) Field of Classification Search
CPC ................................ G02B 5/0816; G02B 5/10
(Continued)

(56) References Cited

U.S. PATENT DOCUMENTS 6,011,646 A 1/2000 Mirkarimi et al.
6,309,705 B1 * 10/2001 Montcalm ............... C03C 17/36
427/162
(Continued)

FOREIGN PATENT DOCUMENTS

CN 102422225 A 4/2012
CN 102565901 A 7/2012
(Continued)

OTHER PUBLICATIONS

Office Action in corresponding German Application 102014201622. 3, dated Sep. 26, 2014, along with English Translation.
(Continued)

*Primary Examiner* — Elizabeth A Burkhart
(74) *Attorney, Agent, or Firm* — Edell, Shapiro & Finnan, LLC

(57) ABSTRACT

A method for producing a mirror element, in particular for a microlithographic projection exposure apparatus includes: providing a substrate (101, 102, 103, 104, 201, 202, 301, 302, 401, 402, 501, 502, 801, 901, 951, 961); and forming a layer stack (111, 112, 113, 114, 211, 212, 311, 312, 411, 412, 511, 512) on the substrate, wherein the layer stack is formed so that a setpoint curvature of the mirror element for a predetermined operating temperature is generated by a bending force exerted by the layer stack, wherein the substrate has a curvature deviating from the setpoint curvature of the mirror element prior to the formation of the layer stack, and wherein the bending force exerted by the layer stack is at least partly generated by virtue of a post-treatment for changing the layer tension of the layer stack.

10 Claims, 11 Drawing Sheets

(51) Int. Cl.
*G02B 5/08* (2006.01)
*G02B 5/09* (2006.01)
*G21K 1/06* (2006.01)
*G02B 26/08* (2006.01)

(52) U.S. Cl.
CPC ........... *G02B 5/10* (2013.01); *G02B 26/0833* (2013.01); *G21K 1/062* (2013.01); *G21K 2201/064* (2013.01)

(58) Field of Classification Search
USPC ......................................................... 427/162
See application file for complete search history.

(56) References Cited

U.S. PATENT DOCUMENTS

| | | | |
|---|---|---|---|
| 6,465,272 | B1 | 10/2002 | Davis, Jr. et al. |
| 6,737,201 | B2 | 5/2004 | Shoki et al. |
| 6,898,011 | B2 * | 5/2005 | Kandaka ............... B82Y 10/00 359/580 |
| 7,056,627 | B2 | 6/2006 | Shoki et al. |
| 7,314,688 | B2 | 1/2008 | Shoki |
| 7,771,898 | B2 | 8/2010 | Masaki et al. |
| 8,194,322 | B2 | 6/2012 | Shiraishi |
| 9,164,394 | B2 | 10/2015 | Endres |
| 2003/0186624 | A1 | 10/2003 | Koike et al. |
| 2004/0224526 | A1 | 11/2004 | Shoki |
| 2005/0026332 | A1 | 2/2005 | Fratti et al. |
| 2007/0188870 | A1 | 8/2007 | Miyake |
| 2008/0166534 | A1 | 1/2008 | Baradzi |
| 2008/0153010 | A1 * | 6/2008 | Sugiyama ............... B82Y 10/00 430/5 |
| 2010/0246036 | A1 | 9/2010 | Langa' et al. |
| 2011/0001947 | A1 | 1/2011 | Dinger et al. |
| 2011/0318696 | A1 | 12/2011 | Endres |
| 2012/0182606 | A1 | 7/2012 | Weissenrieder et al. |
| 2012/0314281 | A1 | 12/2012 | Von Blanckenhagen |
| 2013/0265667 | A1 | 10/2013 | Liu |
| 2014/0212794 | A1 | 7/2014 | Maeshige et al. |

FOREIGN PATENT DOCUMENTS

| | | |
|---|---|---|
| CN | 102759765 A | 10/2012 |
| DE | 10314212 A1 | 11/2003 |
| DE | 102005044716 A1 | 4/2007 |
| DE | 102008009600 A1 | 8/2009 |
| DE | 102008042212 A1 | 4/2010 |
| DE | 102009033511 A1 | 1/2011 |
| EP | 1378918 A1 | 1/2004 |
| EP | 1775604 A1 | 4/2007 |
| JP | S58217901 A | 12/1983 |
| JP | 06186418 A | 7/1994 |
| JP | 106186418 A1 | 7/1994 |
| JP | 09197124 A | 7/1997 |
| JP | 2002504715 A | 2/2002 |
| JP | 2002222764 A | 8/2002 |
| JP | 2002311198 A | 10/2002 |
| JP | 2003505891 A | 2/2003 |
| JP | 2004128490 A | 4/2004 |
| JP | 2007108194 A | 4/2007 |
| JP | 2007193131 A | 8/2007 |
| JP | 2007329368 A | 12/2007 |
| JP | 2008101916 A | 5/2008 |
| JP | 2008109060 A | 5/2008 |
| JP | 2008225421 A | 9/2008 |
| JP | 2008270808 A | 11/2008 |
| JP | 2012519951 A | 8/2012 |
| TW | 200641388 A | 12/2006 |
| TW | 201331699 A | 8/2013 |
| WO | 9942414 A1 | 8/1999 |
| WO | 9942901 A1 | 8/1999 |
| WO | 2004029692 A2 | 4/2004 |
| WO | 2005026843 A2 | 3/2005 |
| WO | 2006092919 A1 | 9/2006 |
| WO | 2007033964 A1 | 3/2007 |
| WO | 2007055401 A1 | 5/2007 |
| WO | 2006092919 A1 | 8/2008 |
| WO | 2012104136 A1 | 1/2012 |
| WO | 102011003357 A1 | 8/2012 |
| WO | 2013050199 A1 | 4/2013 |
| WO | 2013077430 A1 | 5/2013 |

OTHER PUBLICATIONS

International Preliminary Report on Patentability and Written Opinion in counterpart International Application No. PCT/EP2015/051791, dated Aug. 2, 2016, along with English Translation.

J. M. Freitag et al., "Stress evolution in Mo/Si multilayers for high-reflectivity extreme ultraviolet mirrors", Applied Physics Letters, vol. 73, No. 1, Jul. 6, 1998.

International Search Report and Written Opinion in counterpart International Application No. PCT/EP2015/051791, dated May 8, 2015.

CN Office Action and Search Report with English translation, CN Application No. 201580004334.9 , dated May 29, 2019, 15 pages.

JP Office Action, dated Jan. 8, 2019, 12 pages.

JP Office Action, English translation, drafting date, dated Dec. 28, 2018, 10 pages.

Office Action in corresponding German Application 15705920.5, dated Apr. 26, 2018, along with English Translation.

Office Action and Search Report in corresponding Chinese Application 201580004334.9, dated May 4, 2018, along with English Translation.

* cited by examiner

METHOD FOR PRODUCING A MIRROR ELEMENT

CROSS REFERENCE TO RELATED APPLICATIONS

This is a Continuation of International Application PCT/EP2015/051791, which has an international filing date of Jan. 29, 2015, and the disclosure of which is incorporated in its entirety into the present Continuation by reference. The following disclosure is also based on and claims the benefit of and priority under 35 U.S.C. § 119(a) to German Patent Application No. DE 10 2014 201 622.3, filed Jan. 30, 2014, which is also incorporated in its entirety into the present Continuation by reference.

FIELD OF THE INVENTION

The invention relates to a method for producing a mirror element, in particular for a microlithographic projection exposure apparatus.

BACKGROUND

Microlithography is used for producing microstructured components, such as for example integrated circuits or LCDs. The microlithography process is carried out in a so-called projection exposure apparatus having an illumination device and a projection lens. The image of a mask (reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the EUV (extreme ultraviolet) range, i.e. at wavelengths of e.g. approximately 13 nm or approximately 7 nm, owing to the lack of availability of suitable light-transmissive refractive materials, mirrors are used as optical components for the imaging process.

In the illumination device of a microlithographic projection exposure apparatus designed for operation in the EUV range, in particular the use of facet mirrors in the form of field facet mirrors and pupil facet mirrors as focusing components is known for example from DE 10 2008 009 600 A1. Such facet mirrors are constructed from a multiplicity of individual mirrors or mirror facets, which each can be designed to be tiltable by way of flexure bearings for the purposes of adjusting, or else for realizing specific illumination angle distributions. These mirror facets can comprise a plurality of micromirrors in turn.

Moreover, the use of mirror arrangements which comprise a multiplicity of mutually independently adjustable mirror elements in an illumination device of a microlithographic projection exposure apparatus, designed for operation at wavelengths in the VUV range, for adjusting defined illumination settings (i.e. intensity distributions in a pupil plane of the illumination device) is also known, for example from WO 2005/026843 A2.

A problem occurring in practice is that mechanical tensions are generated during the layering process (i.e. when applying a layer stack including a reflection layer system onto the mirror substrate) during the production of such a mirror arrangement, e.g. a field facet mirror of an illumination device designed for operation in EUV, which mechanical tensions can lead to a deformation of the substrate and to an impairment of the optical imaging properties accompanying this. In order to overcome this problem, it is known to form an additional layer which compensates this mechanical tension in order to minimize the overall mechanical tension within the respective mirror element.

Moreover, in practice there is a need during the production of mirror elements to adjust the respective refractive power of the mirror element as exactly as possible (wherein this may be a refractive power of zero, corresponding to a plane mirror element, or else a refractive power differing from zero, depending on the application). An approach known to this end during the manufacturing of the mirror element consists of designing the substrate, which, inter alia, is to be coated with the reflection layer system, in accordance with the desired "end specification" of the mirror element in terms of the geometry thereof, already before the application of the layer stack, e.g. forming aspheres, fine corrections, etc., and of subsequently carrying out the coating process (i.e. the application of the layer stack including the reflection layer system), for example by using the aforementioned tension compensation, in such a way that the form of the substrate is no longer changed during the coating.

In relation to the prior art, reference is made merely by way of example to WO 2004/029692 A2, DE 10 2009 033 511 A1, DE 10 2008 042 212 A1, U.S. Pat. No. 6,011,646 A, US 2008/0166534 A1, U.S. Pat. No. 7,056,627 B2, WO 2013/077430 A1 and DE 10 2005 044 716 A1.

SUMMARY

It is an object of the present invention to provide a method for producing a mirror element, in particular for a microlithographic projection exposure apparatus, which enables the generation of a desired refractive power with as little manufacturing outlay as possible.

This object is achieved by methods in accordance with the features of the independent patent claims.

A method according to the invention for producing a mirror element, in particular for a microlithographic projection exposure apparatus, comprises:

providing a substrate; and forming a layer stack on the substrate, wherein this layer stack has at least one reflection layer system;

wherein the layer stack is formed so that a setpoint curvature of the mirror element sought for a predetermined operating temperature is generated by a bending force exerted by the layer stack, wherein the substrate has a curvature deviating from this setpoint curvature of the mirror element prior to the formation of the layer stack, and wherein the bending force exerted by the layer stack is at least partly generated by virtue of a post-treatment for changing the layer tension of the layer stack being carried out.

In particular, the invention is based on the concept of not eliminating the mechanical tension generated in the production of a mirror element during the application of a layer stack including a reflection layer system onto a substrate, for example by an additional compensation layer acting counter to this mechanical tension (or a compensation layer system acting counter to this mechanical tension), but rather of using, in a targeted manner, the mechanical tension generated during the application of the layer stack including the reflection layer system onto the substrate and the bending force exerted as a result thereof by the layer stack on the substrate in order to generate a desired setpoint curvature of the mirror element—and hence a wanted finite refractive power of the mirror element. Here, the substrate has a curvature deviating from the wanted setpoint curvature of the mirror element before the formation of the layer stack.

The invention contains, in particular, a deliberate departure from conventional approaches, in which, for the purposes of manufacturing a mirror element, the substrate is initially designed by suitable processing steps (e.g. by way of the formation of aspheres, fine corrections, etc.) in accordance with the desired "end specification" of the mirror element and in which, subsequently, care is taken during the application of the layer stack including the reflection layer system to ensure that the relevant mirror substrate form, which has already been predetermined in a targeted manner, is maintained by using tension-compensating layer(s).

Rather, the present invention contains the principle of, during the manufacture of a mirror element, proceeding from a form or geometry of the substrate prior to applying the layer stack containing the reflection layer system, which form or geometry does not yet correspond to the curvature ultimately wanted for the completed mirror element, in order then to deform the substrate deliberately using the mechanical tension generated during the application of the layer stack including the reflection layer system. The ultimately emerging radius of curvature of the substrate and hence the refractive power of the completed mirror element is therefore obtained as a result of the original form or geometry (including the thickness) of the substrate and the parameters adjusted during the application of the layer stack including the reflection layer system (possibly with additional use of a post-treatment as explained below).

In accordance with one embodiment, the bending force exerted by the layer stack, in particular the post-treatment for changing the layer tension of the layer stack, brings about an irreversible change in the curvature.

The post-treatment for changing the layer tension of the layer stack can, in particular, comprise a thermal post-treatment, for example by heat irradiation, laser irradiation or annealing (wherein the post-treatment is still carried out prior to the operation of the optical system or the projection exposure apparatus, i.e. still during the production of the relevant mirror element). Moreover, alternatively or additionally, the post-treatment can comprise ion irradiation or electron irradiation. Furthermore, the post-treatment can be locally restricted to one or more portions of the layer stack (which, in the totality thereof, are smaller than the overall extent or area of the layer stack) in order, for example, to subject corner or edge regions of a mirror element to different post-treatment than the remaining region of the relevant mirror element.

In accordance with one embodiment, the substrate has a locally varying rigidity, which is selected in such a way that the setpoint curvature of the mirror element wanted for the predetermined operating temperature is obtained after the formation of the layer stack.

The invention furthermore also relates to a method for producing a mirror element, wherein the method comprises:
providing a substrate; and
forming a layer stack on the substrate, wherein this layer stack has at least one reflection layer system;
wherein the substrate is subject to processing which influences the rigidity prior to the formation of the layer stack, wherein the rigidity is set during this processing in such a way that a setpoint curvature of the mirror element wanted for a predetermined operating temperature is obtained after the formation of the layer stack.

In accordance with this aspect, the invention contains the further concept of influencing the rigidity of the substrate by way of suitable processing in such a targeted manner that, after the application of the layer stack including the reflection layer system, the ultimately obtained surface geometry meets the requirements, i.e. the wanted setpoint curvature of the mirror element is obtained.

In other words, the current approach ensures by appropriate manufacturing or processing of the substrate that the substrate reacts in a desired way to the bending force exerted by the layer stack as a consequence of the rigidity adjusted in a targeted manner. As a result, it is also possible to take account of the fact that, for example, a possibly wanted locally varying bending of the substrate, which generally cannot be achieved, or can only be achieved with difficulty, by a local variation of the bending force caused by the layer stack, can also be brought about according to the invention by influencing of the rigidity of the substrate in a targeted manner.

In accordance with one embodiment, a locally varying rigidity of the substrate is set, which rigidity, in combination with the bending force exerted by the layer stack, results in a desired surface geometry of the mirror element.

In accordance with one embodiment, the rigidity is caused at least in part by a varying thickness profile of the substrate.

For the purposes of varying the thickness profile of the substrate, use can be made of suitable material-ablating or else material-adding methods. By way of example, the material ablation can be brought about by etching or ion beam processing (IBF="ion beam figuring") or else by any other suitable methods for material ablation. By way of example, the material addition can comprise a sputtering method, an electron beam vapor deposition or any other methods for material application.

In accordance with one embodiment, the substrate is produced from a first material, wherein the rigidity is caused at least in part by doping with foreign atoms of a second material which differs from the first material. Moreover, e.g. an ion implantation is also possible. Such doped or implanted foreign atoms or ions can be e.g. oxygen, nitrogen, fluorine or hydrogen atoms or ions.

Further options for influencing the rigidity are a targeted chemical change brought about region-by-region, for example by oxidizing or nitriding the substrate material, for example a chemical conversion, which is amplified in a targeted manner in the surface region, of silicon as a substrate material to silicon dioxide ($SiO_2$) or silicon nitride ($Si_3N_4$), or else a laser treatment. Here, it is also possible to obtain a change in the morphology (e.g. phase or crystal orientation) as an alternative to a targeted change in the chemical structure (oxidation, etc.).

In accordance with one embodiment, the rigidity is caused at least in part by a structure or layer influencing the rigidity, which, in particular, can be arranged on the side of the substrate which is opposite to the layer stack. Such a structure can comprise e.g. additional lamellas on the side of the substrate facing away from the reflection layer stack ("substrate rear side") or else an additional layer influencing the rigidity. In further embodiments, such a structure or layer can also be arranged on the substrate front side or the side of the substrate facing the reflection layer stack. Moreover, interstices remaining in such a structure, for example between lamellas, can be refilled with a different material, or else with the same material with a deviating orientation, density, etc., in embodiments of such a structure, for example in order to obtain a homogeneous or flat surface.

In accordance with one embodiment, the substrate is plane or has a convex curvature prior to the formation of the layer stack.

In accordance with one embodiment, the layer stack has an additional tension-inducing layer between the reflection layer system and the substrate. Such an additional tension-inducing layer can be produced as a layer from a metallic material, such as nickel, titanium, etc., or else, for example, as a (further) molybdenum-silicon stack with a high Γ-value of e.g. more than 0.5 (wherein the Γ-value, as defined further below, specifies the ratio of the absorber ply thickness to the overall thickness of a period of the relevant layer stack) and it can be designed in a targeted manner in such a way that, as a result, the desired mechanical tension is generated in the layer system. However, the invention is not restricted thereto, and so, if necessary, the wanted mechanical tension in the layer system can also be generated only by a suitable design of the reflection layer system.

In principle, it should be noted that the curvature of the substrate or the mirror element is temperature-dependent, with it being possible, for example, for a curvature that is concave at a predetermined temperature to be converted into a convex curvature with increasing temperature. The curvature or refractive power of the completed mirror element generated by the method according to the invention is generated taking into account this temperature-dependence in such a way that the wanted (e.g. concave) curvature emerges precisely at the predetermined operating temperature.

In accordance with one embodiment, the wanted setpoint curvature of the mirror element is a concave curvature for an operating temperature of at least 100° C.

In accordance with one embodiment, a plurality of mirror elements are produced in each case when the aforementioned steps are carried out, wherein at least two of these mirror elements differ from one another in terms of the setpoint curvature.

In accordance with one embodiment, the production of the mirror elements with mutually different setpoint curvatures is carried out by virtue of a layer stack being applied to substrates with different thicknesses in each case, with the same bending force exerted by the respective layer stack being set.

In accordance with one embodiment, the production of the mirror elements with mutually different setpoint curvatures is carried out by virtue of a layer stack being applied to substrates with the same thickness in each case, with different bending forces exerted by the respective layer stack being set.

In accordance with one embodiment, the mirror element is a mirror element of a mirror arrangement composed of a plurality of mirror elements. In particular, these mirror elements can be tiltable independently of one another.

In accordance with one embodiment, the mirror arrangement is a facet mirror, in particular a field facet mirror or a pupil facet mirror.

In accordance with one embodiment, the mirror element is designed for an operating wavelength of less than 30 nm, in particular less than 15 nm. However, the invention is not restricted thereto, and so the mirror element can also be designed for a wavelength in the VUV range, in particular a wavelength of less than 200 nm, in further applications.

In accordance with one embodiment, the mirror element is a mirror element of a microlithographic projection exposure apparatus. However, the invention is not restricted thereto; rather, it is also realizable for example in measurement constructions which, in particular, can be designed for operation in EUV.

In some embodiments, the curvature of the relevant mirror element or mirror elements can additionally be corrected by setting the temperature of the relevant mirror element during operation of the optical system, in particular of the microlithographic projection exposure apparatus. In other words, in some embodiments of the invention, there still can be an adaptation of the curvature or refractive power of the individual mirror elements during the operation of the optical system (in particular of the projection exposure apparatus) by heating (in particular in an inhomogeneous manner) the relevant mirror element (or the mirror elements of the mirror arrangement), wherein the curvature of the relevant mirror element varies depending on the operating temperature present at the corresponding position. Here, the curvature or refractive power of the individual mirror elements can be corrected by virtue of the temperature of the relevant mirror elements or micromirrors being predetermined and adjusted or controlled. In particular, there can for example be, initially, an approximate adjustment of the curvature or refractive power using the bending force by way of the embodiment according to the invention, described above, of the reflection layer stack and a fine adjustment ("fine-tuning") by way of the last-mentioned temperature adjustment.

The invention furthermore relates to a mirror element which is produced using a method according to the invention.

Moreover, the invention relates to a mirror element, in particular for a microlithographic projection exposure apparatus, comprising a substrate and a layer stack arranged on the substrate, wherein the layer stack has at least one reflection layer system, wherein the substrate has a locally varying rigidity due to a structure, layer or doping influencing the rigidity or due to a region with a changed chemical structure or morphology.

The structure or layer can be arranged, in particular, on the side of the substrate facing away from the layer stack ("substrate rear side") and, for example, comprise additional lamellas or else an additional layer which influences the rigidity. In further embodiments, such a structure or layer can also be arranged on the substrate front side or the side of the substrate facing the reflection layer stack.

The invention furthermore relates to an optical system of a microlithographic projection exposure apparatus, in particular an illumination device or a projection lens, and a microlithographic projection exposure apparatus.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In detail.

DETAILED DESCRIPTION

Figure 1A:
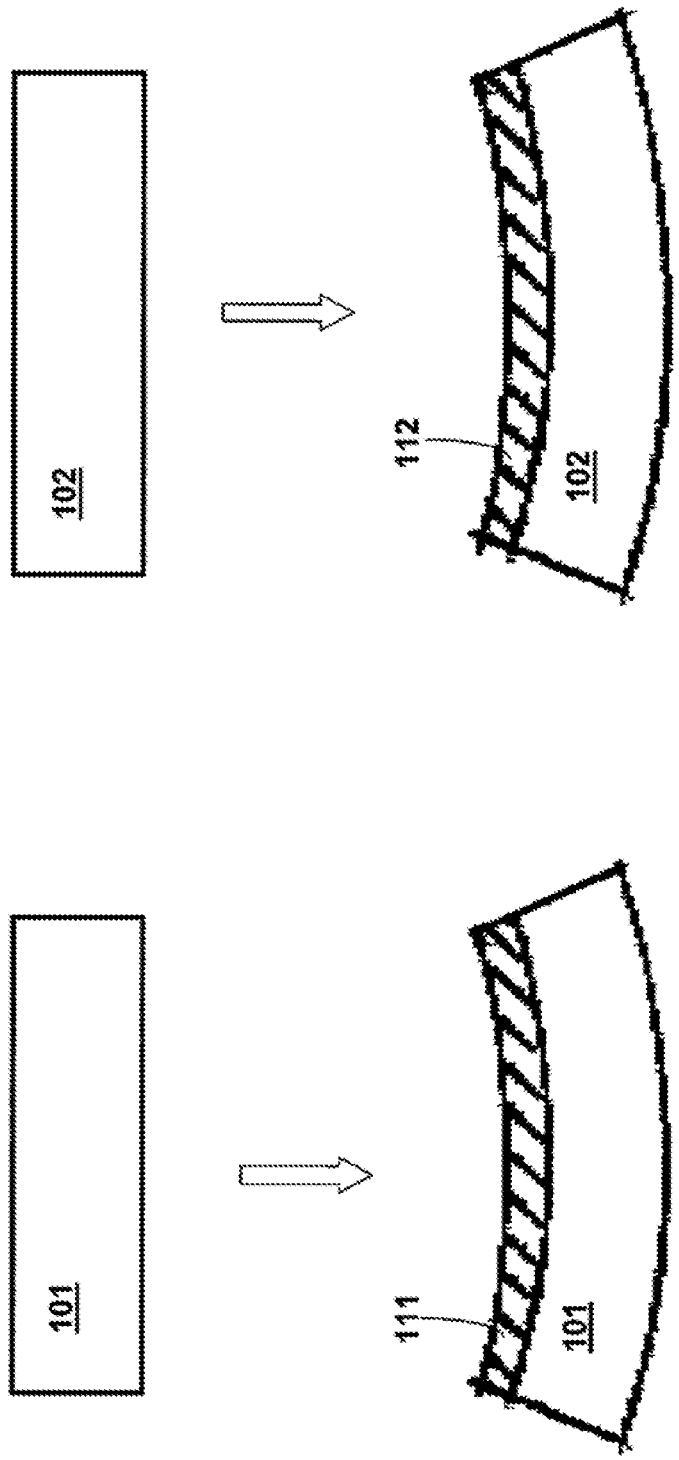
FIGS. 1A, 1B and 2-5 show schematic illustrations for explaining possible embodiments of a method according to the invention.

Possible embodiments of a method according to the invention for producing a mirror element are initially described below with reference to FIGS. 1A-5. The produced mirror elements can be e.g. mirror elements or micromirrors of a mirror arrangement in the form of a field facet mirror (without the invention being restricted thereto), wherein the individual mirror elements can have identical or else differing curvatures or refractive powers.

In all embodiments, a layer stack, which has a reflection layer system (e.g. as a multiple layer system made of molybdenum and silicon layers), is applied onto a substrate in each case. The mirror substrate material can be, for example, silicon (Si) or quartz glass doped with titanium dioxide ($TiO_2$), with examples of materials that are usable being those sold under the trade names ULE® (by Corning Inc.) or Zerodur® (by Schott AG). In further embodiments, the mirror substrate material can also comprise germanium (Ge), diamond, gallium arsenide (GaAs), gallium nitride (GaN), gallium antimonide (GaSb), gallium phosphide (GaP), $Al_2O_3$, indium phosphide (InP), indium arsenide (InAs), indium antimonide (InSb), calcium fluoride ($CaF_2$), zinc oxide (ZnO) or silicon carbide (SiC). Optionally, further functional layers, such as e.g. a capping layer ("cap layer"), a substrate protection layer, etc., can be provided in a manner known per se.

What is common to the exemplary embodiments described with reference to FIG. 1A to FIG. 5 is that a bending force of the layer stack different from zero is exerted on the substrate in each case when forming the layer stack comprising the reflection layer system by way of a suitable adjustment of the coating parameters and/or the parameters of a post-treatment and the mechanical tension generated thereby.

According to the invention, the mechanical tension when forming the respective layer stack is adjusted in a manner known per se by virtue of materials and thickness ratios (e.g. the ratio of the absorber ply thickness to the overall thickness of a period, wherein this thickness ratio is also referred to as Γ) being adjusted in the desired manner in the reflection layer system in particular. The procedure when adjusting a mechanical tension is known to a person skilled in the art, for example from DE 10 2008 042 212 A1. Moreover, the mechanical tension can also be adjusted when applying the respective layer stack by oxygen doping or the addition of oxygen during the coating, as is known to a person skilled in the art from DE 10 2011 003 357 A1.

This mechanical tension generated during the formation on the substrate of the layer stack comprising the reflection layer system leads to the curvature of the substrate changing in comparison with the original curvature which was present in the state prior to the coating. Either said original curvature of the substrate in the state prior to the coating can equal zero (i.e. the substrate is plane prior to the coating) or the original curvature can correspond to a finite curvature (e.g. a convex curvature) not yet corresponding to the wanted setpoint curvature of the completed mirror element.

The individual embodiments of FIGS. 1A-5 differ in the manner in which the various mirror elements (e.g. of a mirror arrangement such as a field facet mirror) are manufactured with identical or different curvatures depending on the initial form or original curvature of the substrate in the state prior to the coating, the adjustment of the coating parameters in view of the mechanical tension generated hereby and optionally an (e.g. thermal) post-treatment.

In accordance with FIG. 1A, e.g. a plurality of mirror elements with the same curvature or refractive power can be produced by virtue of plane (mirror) substrates 101, 102, . . . , in each case with a layer stack 111, 112, . . . comprising a reflection layer system, being coated in the initial state, with identical coating parameters being set in each case, wherein, during this coating, the generated mechanical tension and the bending force on the respective substrate 101, 102, . . . resulting therefrom are selected in such a way that the wanted curvature (identical in each case for the individual mirror elements) is adjusted in the respective complete mirror element.

Figure 1B:
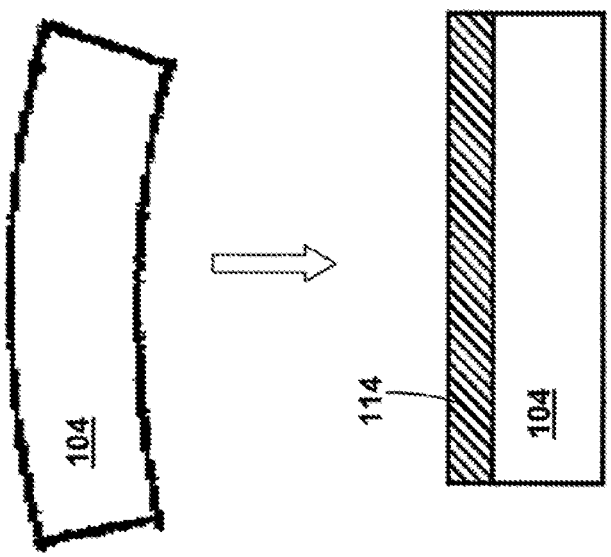

In accordance with FIG. 1B, the respective substrates 103, 104, . . . can also have a finite curvature in the initial state (prior to the coating), said finite curvature not yet corresponding to the ultimately wanted curvature, wherein this substrate curvature is then changed by the mechanical tension generated when applying the layer stack or by the exerted bending force. Specifically, a convex curvature of the substrates 103, 104, . . . present in the initial state prior to the coating in the example of FIG. 1b is brought to zero; that is to say, a plane geometry of the completed mirror elements is ultimately generated.

Figure 1B:
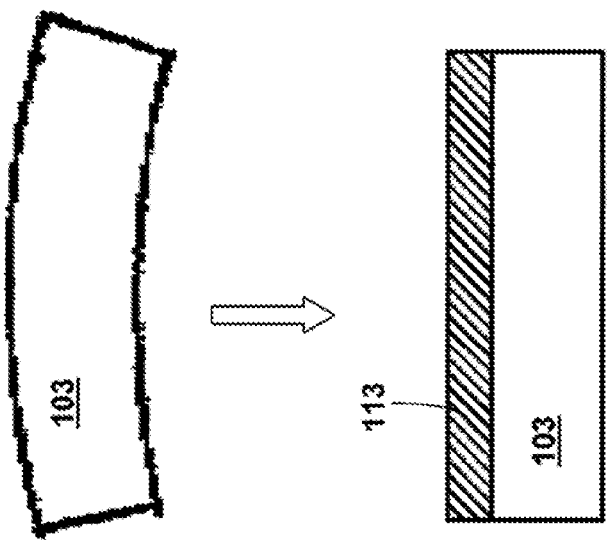
Figure 2:
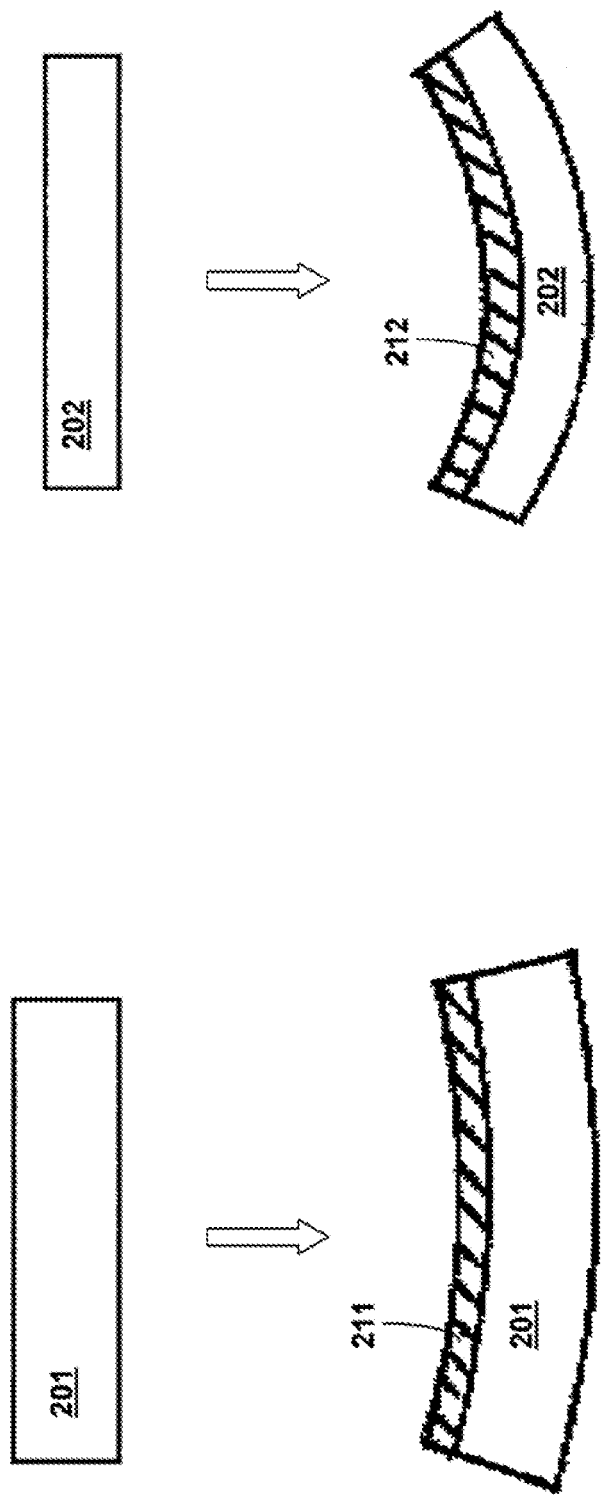
Figure 3:
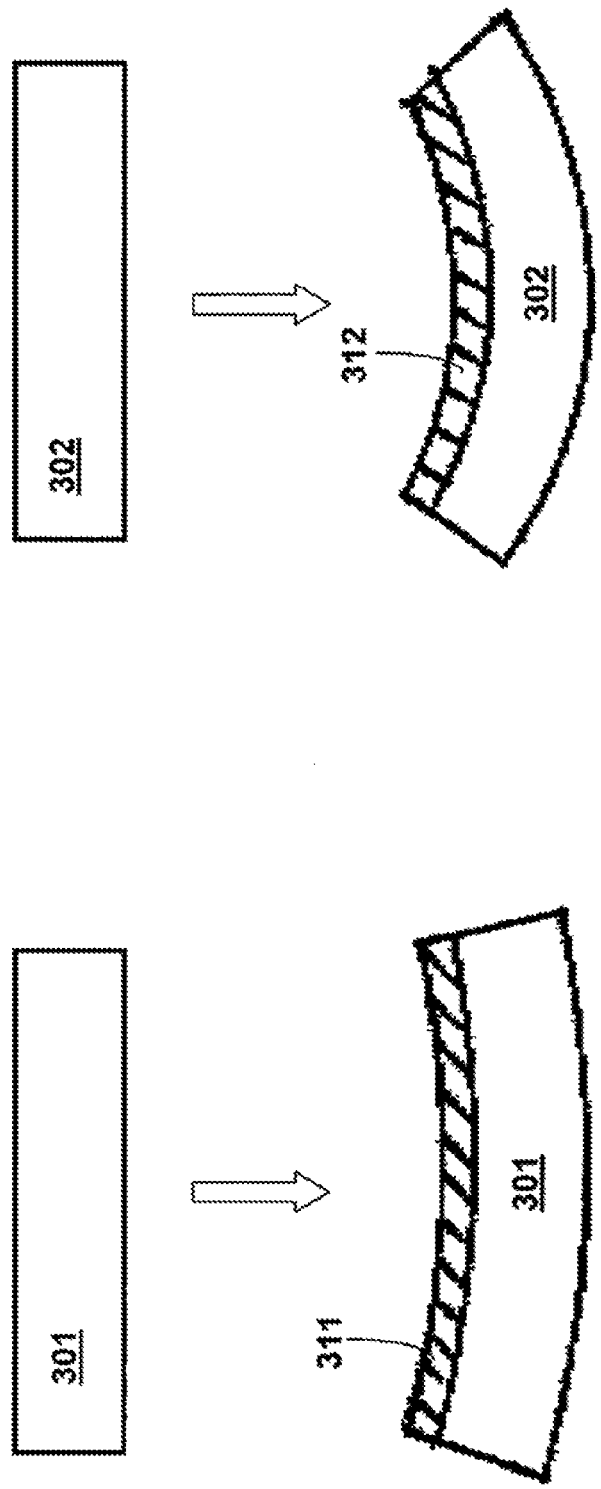

FIGS. 2 and 3 serve to explain possible further exemplary embodiments of the production of a micromirror arrangement, for example in the form of a field facet mirror, in which individual mirror elements should have differing curvatures or different refractive powers. Here, components that are analogous or substantially functionally equivalent in comparison with FIG. 1 are denoted by reference signs increased by "100" in FIG. 2 and by reference signs increased by "200" in FIG. 3.

In accordance with FIG. 2, in order to generate different curvatures in the ultimately manufactured mirror elements, substrates 201, 202, . . . , which are once again plane but which have thicknesses that differ from one another, are coated with in each case one layer stack, with the same mechanical tension or bending force being adjusted. As indicated in the lower part of FIG. 2, this leads to the generation of different curvatures of the completed mirror elements as a result of the different substrate thicknesses (wherein the generated curvature is greater with a smaller substrate thickness in accordance with FIG. 2).

In accordance with FIG. 3, different curvatures in the ultimately manufactured mirror elements are generated, as it were, conversely to FIG. 2 by virtue of (in the example once again plane) substrates 301, 302, . . . of the same thickness being coated with layer stacks 311, 312, . . . , with different mechanical tensions or bending forces being generated. As can be seen from the lower part of FIG. 3, the adjustment of a higher layer tension (right-hand part of FIG. 3) in this case has as a consequence a greater curvature in the ultimately manufactured mirror element. In other embodiment examples (in the case of an initial state with convex curvatures of different magnitudes), a higher layer tension can also lead to a comparatively smaller curvature in the final state.

In further embodiments of the invention, it is also possible to generate mirror elements with differing curvatures by virtue of individual substrates with the same thickness and geometry in the initial state (i.e. prior to the coating) being subjected to coating (i.e. application of the layer stack including the reflection layer system) with identical parameters (with generation of the same mechanical tension) but an (in particular thermal) post-treatment then being carried out thereafter, by which the mechanical tension generated in each case in the layer stacks of the individual mirror elements is subsequently changed. Such a post-treatment can comprise, for example, annealing in an oven (with setting of a defined atmosphere), a thermal post-treatment using a radiant heater or else a post-treatment using laser irradiation, ion irradiation or electron irradiation (and also combinations of these methods). Here, suitable cooling can be carried out from the mirror rear side where necessary. Laser irradiation (possibly using a mask only exposing the regions to be subjected to the post-treatment, such as e.g. corners of the mirror element), in particular, is suitable for the targeted post-treatment of individual local regions of a mirror element. In this way, it is possible to post-treat or deform e.g. corner or edge regions of a mirror element differently to the remaining region of the relevant mirror element. Moreover, the post-treatment described above can be carried out in an identical manner for all manufactured mirror elements, individually for individual mirror elements (or else relatively large units of in each case a plurality of mirror elements in the form of mirror arrays) or else in a manner varying locally over individual mirror elements, as described above.

Figure 4:
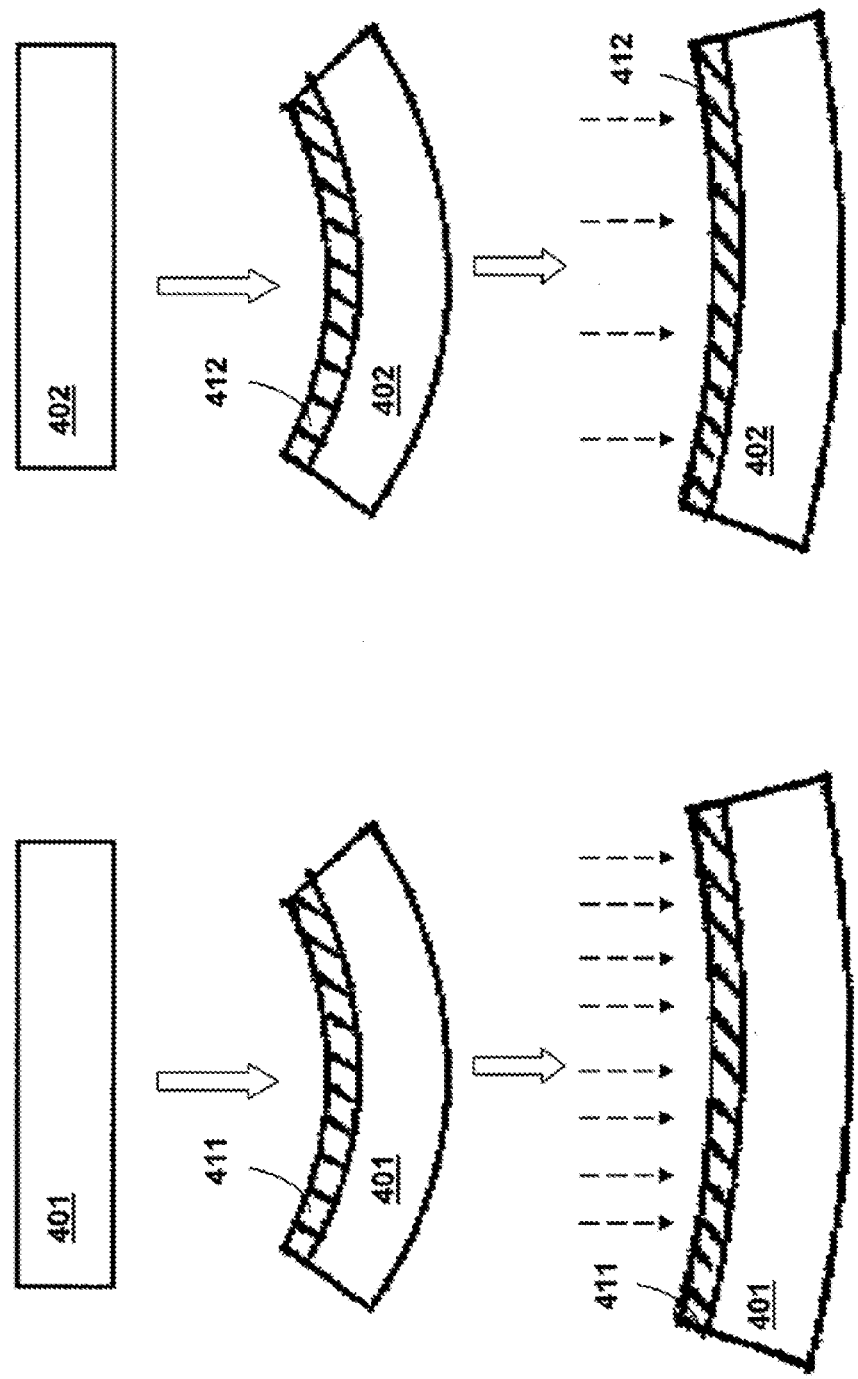

For the purposes of explaining this principle, FIG. 4 shows how an initially uniform or identical coating of substrates 401, 402, . . . with a layer stack 411, 412, . . . in each case initially leads to an identical curvature (central part of FIG. 4), but then to different curvatures or refractive powers of the mirror elements manufactured in each case by way of different post-treatments.

Figure 5:
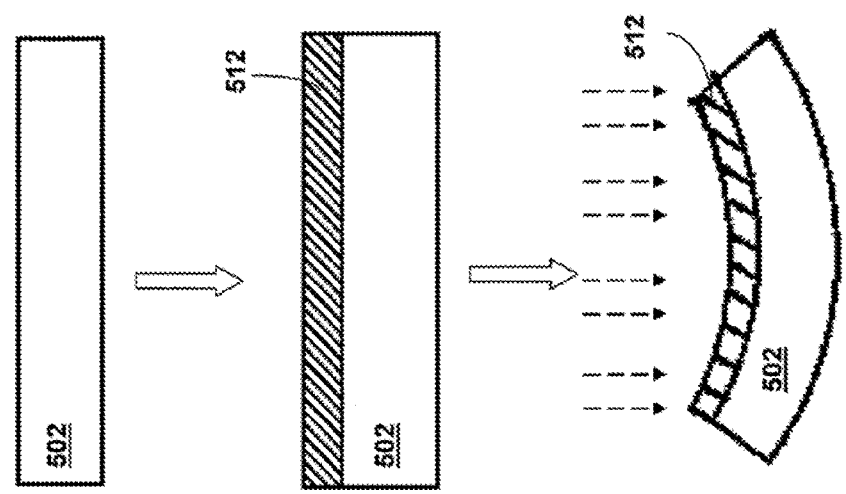
Figure 5:
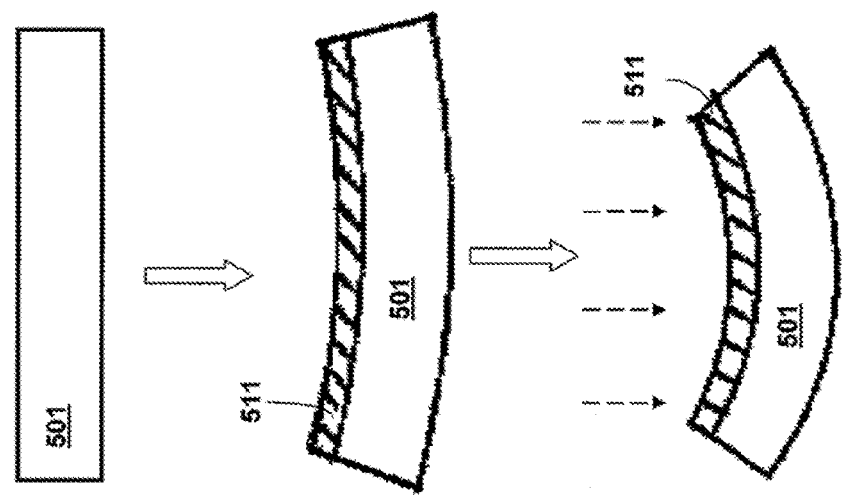

As depicted schematically in FIG. 5, the post-treatment described above can also be used to "homogenize" an unwanted curvature (e.g. an inhomogeneous curvature or a curvature varying for a plurality of substrates 501, 502, . . . ), which is initially generated on the substrate after forming the layer stack including the reflection layer system or else already present prior to the coating, and which may result from e.g. process variations in the individual coating processes, with the consequence that the ultimately manufactured mirror elements have the same curvature or refractive power.

Below, embodiments of the invention are described with reference to FIGS. 8A-10B, in which embodiments (in addition or as an alternative to the method steps described above on the basis of FIGS. 1A-5) there is targeted influencing of the rigidity of the substrate prior to the application of the layer stack including the reflection layer system. The relevant mirror element can be, in particular, a mirror element of a micromirror arrangement, e.g. of a field facet mirror, in the embodiments in accordance with FIGS. 8A-10B too.

This approach is based on the idea that targeted influencing of the rigidity of the substrate determines the "reaction" thereof to the bending force exerted by the layer stack including the reflection layer system and hence is likewise suitable for ultimately bringing about, or contributing to, a wanted surface geometry or setpoint curvature of the mirror element.

In the embodiments merely depicted schematically in FIGS. 8A-10B, the aforementioned, targeted influencing of the rigidity of the substrate is carried out by virtue of material-ablating or material-adding processing of the substrate being carried out.

Figure 8B:
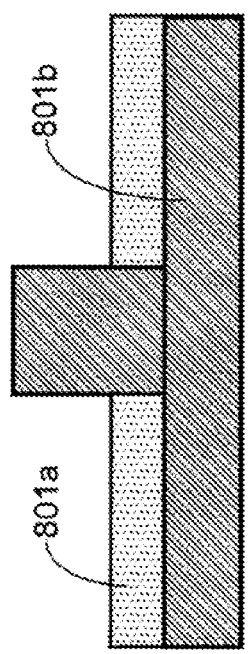
FIGS. 8A, 8B, 9A, 9B, 10A, and 10B show schematic illustrations for explaining further possible embodiments of the invention.
Figure 8A:
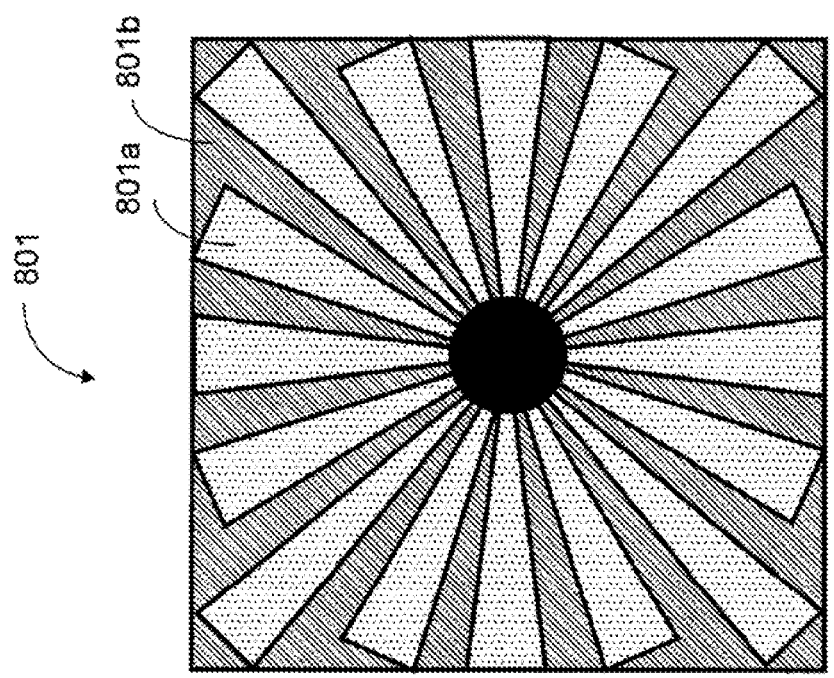
Figure 9B:
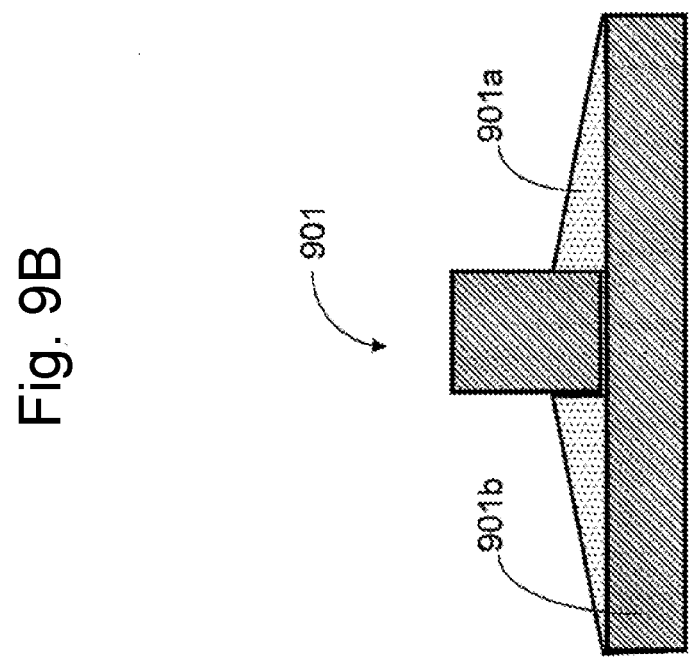
Figure 9A:
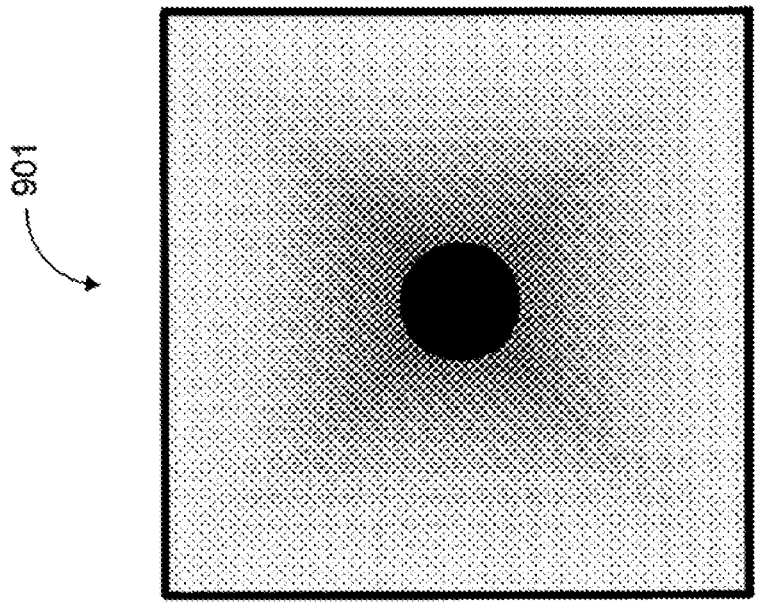

In accordance with FIG. 8A (rear view) and FIG. 8B (cross section), a substrate 801 was thinned in a plurality of regions 801a (which are only arranged in the form of spokes in an exemplary manner), for example through etching, such that it has a comparatively greater thickness in the remaining regions 801b. In merely an exemplary manner, FIGS. 9A and 9B show, in a rear view (FIG. 9A) and cross section (FIG. 9B), a further embodiment of a substrate 901 with a continuous thickness ablation in the radial direction. In further embodiments, a continuous thickness variation in accordance with FIG. 9B can also be combined with the refinement of FIG. 8A (i.e. the corresponding geometry of the respective regions in a rear view) or the thickness variation in accordance with FIG. 8B can be combined with the refinement in accordance with FIG. 9A (i.e. the corresponding geometry of the respective regions in a rear view), etc.

Figure 10A:
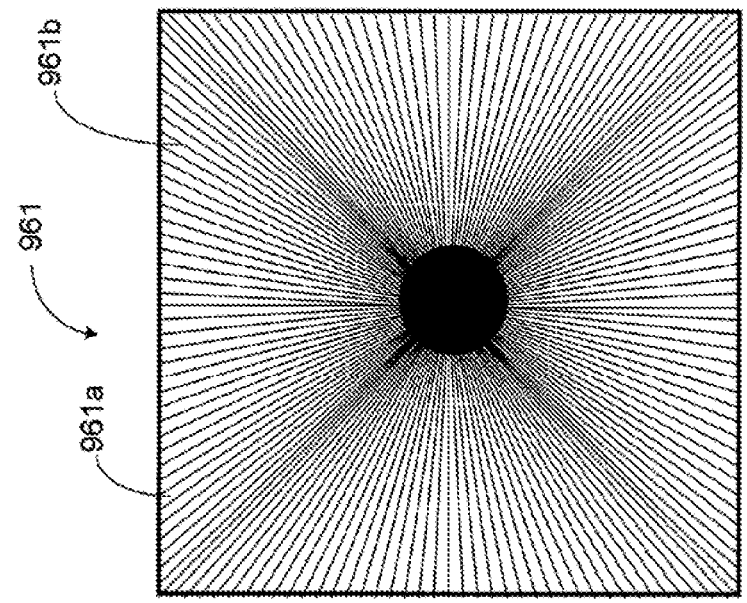
Figure 10B:
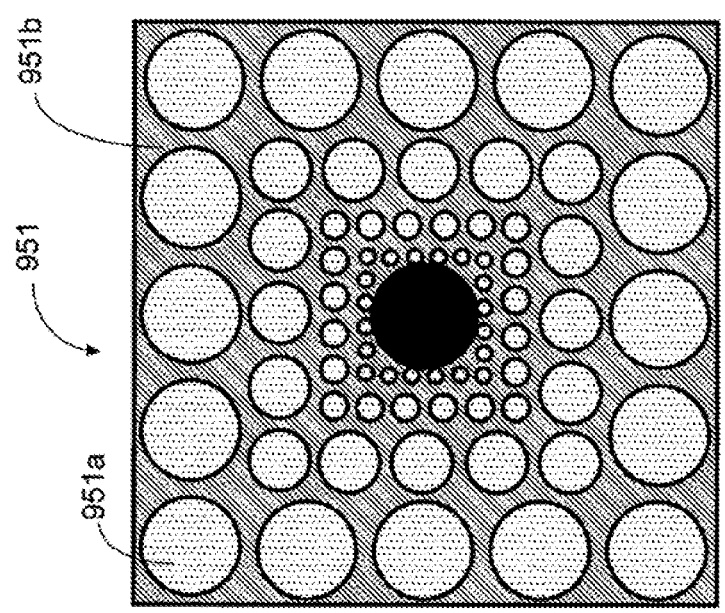

FIGS. 10A and 10B show, likewise in a merely exemplary manner, further refinements, wherein, in FIG. 10A, a substrate 951 was thinned in circular regions 951a of different sizes (once again for generating regions 951a and 951b with different thicknesses) and wherein, in accordance with FIG. 10B, a substrate 961 was provided with thin webs arranged in the radial direction (as regions 961b with a relatively large thickness, between which there therefore likewise are relatively thinner regions 961a).

In respect of influencing the substrate in terms of rigidity, the invention is not restricted to material-ablating or material-adding processing of the substrate. Thus, in further embodiments, the rigidity of the substrate can also be influenced at least in part by doping with foreign atoms or ion implantation (e.g. of oxygen, nitrogen, fluorine or hydrogen atoms or ions), by chemical conversion, laser treatment or else by a structure influencing the rigidity (e.g. in the form of lamellas), which structure can be arranged, in particular, on the side of the substrate opposite to the layer stack ("substrate rear side"). An arrangement on the side of the substrate facing the layer stack ("substrate front side") is likewise possible, wherein care has to be taken that the wanted optical properties are not impaired.

In some embodiments, the respective interstices of a structure, e.g. between lamellas, can be refilled with a different material or else with the same material with a deviating orientation, density, etc., in order, for example, to obtain a homogeneous or smooth surface.

In further embodiments, an additional layer influencing the rigidity can also be provided on the side of the substrate facing away from the reflection layer stack.

Figure 6:
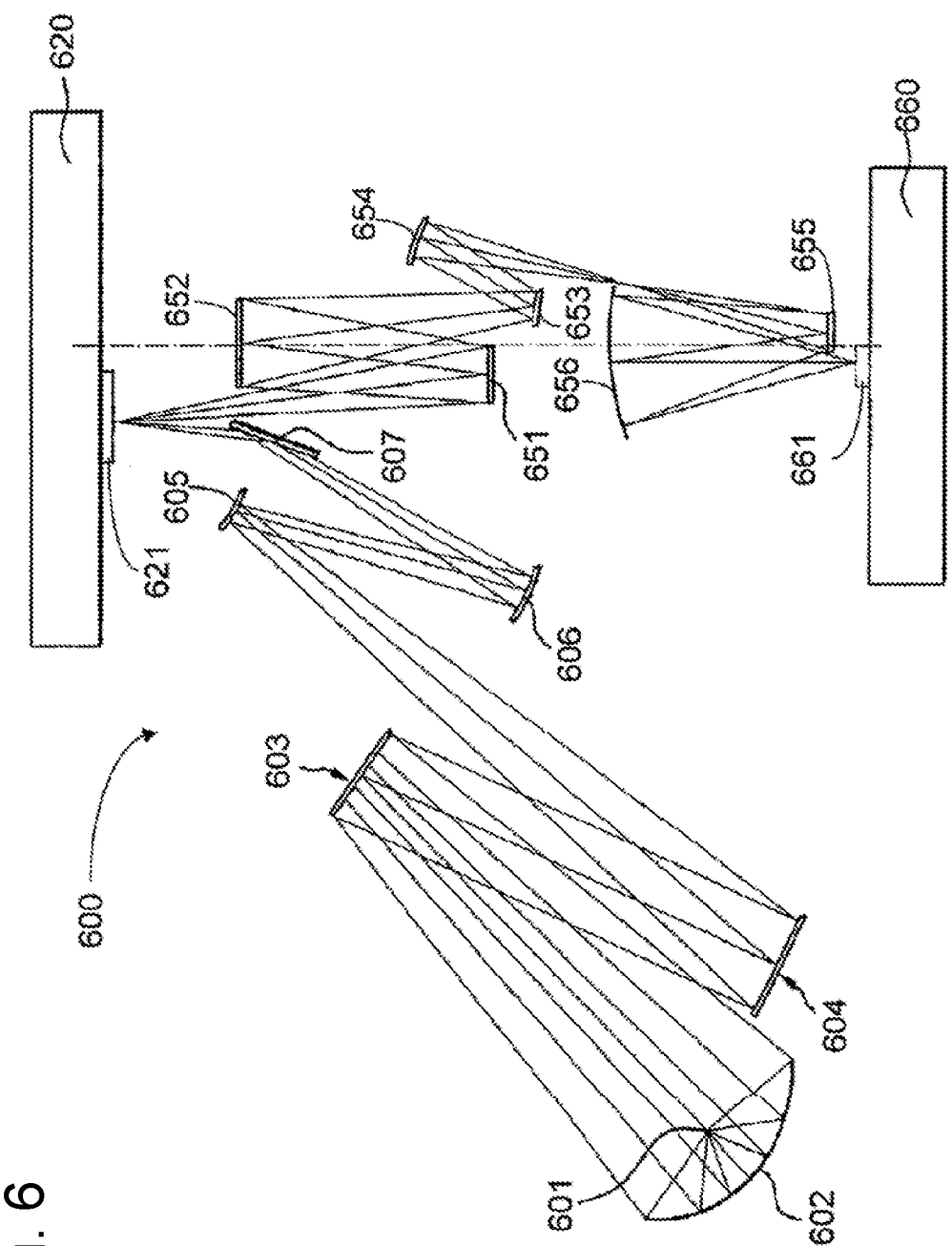
FIGS. 6-7 show schematic illustrations for explaining the possible construction of a microlithographic projection exposure apparatus designed for operation in EUV.

FIG. 6 shows a schematic illustration of one exemplary projection exposure apparatus which is designed for operation in EUV and in which the present invention can be realized.

According to FIG. 6, an illumination device in a projection exposure apparatus 600 designed for EUV comprises a field facet mirror 603 and a pupil facet mirror 604. The light from a light source unit comprising a plasma light source 601 and a collector mirror 602 is directed onto the field facet mirror 603. A first telescope mirror 605 and a second telescope mirror 606 are arranged in the light path downstream of the pupil facet mirror 604. A deflection mirror 607 is arranged downstream in the light path, said deflection mirror directing the radiation that is incident on it onto an object field in the object plane of a projection lens comprising six mirrors 651-656. Arranged on a mask stage 620 at the location of the object field is a reflective structure-bearing mask 621, which with the aid of the projection lens is imaged into an image plane, in which there is a substrate 661 coated with a light-sensitive layer (photoresist) on a wafer stage 660.

Without the invention being restricted thereto, the method according to the invention is applicable in a particularly advantageous manner to the manufacture of the field facet mirror 603 from FIG. 6; further particularly if the individual field facets of the field facet mirror 603 in turn are composed of individual mirror elements or micromirrors.

Figure 7:
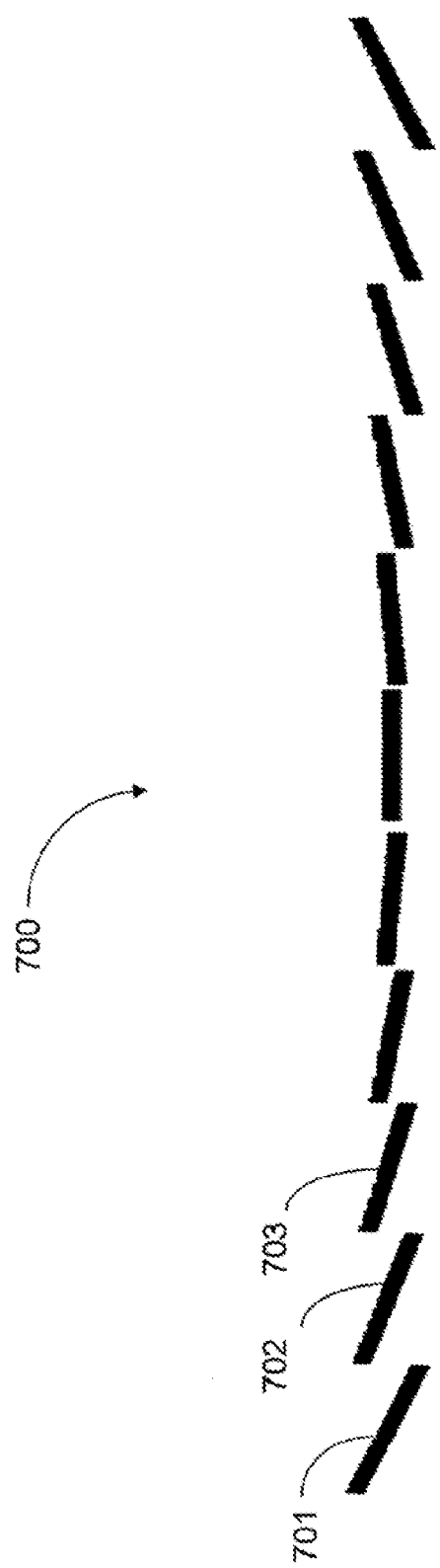

Such "sub-faceting" of the field facet mirror is known to a person skilled in the art as such from US 2011/0001947 A1 and it can, as depicted schematically in FIG. 7 on the basis of a single field facet 700, be e.g. carried out in such a way that a plurality of in each case plane mirror elements 701, 702, 703, . . . are lined up by appropriately adjusting the normal vectors thereof in such a way that, as a result, the typically spherical surface of the (macroscopic) mirror facet is reproduced. However, in so doing, the optical effect of the pupil facets of the pupil facet mirror 604 from FIG. 6 can be impaired by an "incorrect" refractive power of the individual mirror elements 701, 702, 703, . . . or of the field facets 700 of the field facet mirror 603 from FIG. 6.

The stated problem can now be overcome by manufacturing the individual mirror elements 701, 702, 703, . . . of the field facet 700 not in a plane manner, but with a suitable radius of curvature or a suitable refractive power. By way of example, such a curvature or refractive power of the individual mirror elements 701, 702, 703, . . . can be obtained through ion irradiation or grayscale lithography, which, however, is connected with an increased outlay in terms of time and costs (inter alia in view of a required singulation of the mirror elements 701, 702, 703, . . . ). The generation of defined radii of curvature or refractive power by way of exploiting the bending force exerted in the coating process when applying the layer stack onto the respective substrate, described with reference to FIGS. 1A to 5, is particularly well-suited in this case since the coating process (which is necessary in any case and therefore does not require an additional manufacturing step) is simply defined in a suitable manner in order, for example, initially to deform plane substrates in the desired manner (in particular concavely).

However, the invention is not restricted to the application to the facet mirror, and so, as a matter of principle, other mirrors can also be designed in the manner according to the invention (even those which are not composed of a plurality of mirror elements).

Even though the invention has been described on the basis of specific embodiments, numerous variations and alternative embodiments are evident to the person skilled in the art, e.g. through combination and/or exchange of features of individual embodiments. Accordingly, such variations and alternative embodiments are concomitantly encompassed by the present invention, and the scope of the invention is restricted only within the meaning of the appended patent claims and equivalents thereof.

What is claimed is:

1. A method for producing a mirror element, comprising:
   a) providing a substrate; and
   b) forming a layer stack on the substrate, wherein the layer stack has at least one reflection layer system;
   wherein the layer stack is formed such that a setpoint curvature of the mirror element for a predetermined operating temperature is generated by a bending force exerted by the layer stack,
      wherein the substrate has an actual curvature deviating from the setpoint curvature of the mirror element prior to said forming of the layer stack,
      wherein the bending force exerted by the layer stack is at least partly generated by performing a post-treatment for changing a layer tension of the layer stack, and
      wherein the post-treatment for changing the layer tension of the layer stack produces an irreversible change in the actual curvature of the substrate.

2. The method as claimed in claim 1, wherein the post-treatment comprises a thermal post-treatment by heat irradiation, laser irradiation or annealing.

3. The method as claimed in claim 1, wherein the post-treatment comprises ion irradiation or electron irradiation.

4. The method as claimed in claim 1, wherein the post-treatment is locally restricted to at least one portion of the layer stack.

5. The method as claimed in claim 1, wherein the substrate is plane or has a convex curvature prior to said forming of the layer stack.

6. The method as claimed in claim 1, wherein the substrate has a locally varying rigidity selected such that the setpoint curvature of the mirror element for the predetermined operating temperature is obtained after said forming of the layer stack.

7. The method as claimed in claim 1, further comprising:
   installing the mirror element in a microlithographic projection exposure apparatus; and
   correcting the curvature by setting the temperature of the mirror element during operation of the microlithographic projection exposure apparatus.

8. A method, comprising:
   producing the mirror element as claimed in claim 1, wherein the setpoint curvature is a first setpoint curvature, the layer stack is a first layer stack, the bending force is a first bending force, and the mirror element is a first mirror element; and
   providing a further substrate, and forming a further layer stack on the further substrate, wherein the further layer stack has at least one further reflection layer system to produce a second mirror element;
   wherein the further layer stack is formed such that a second setpoint curvature of the second mirror element is generated by a second bending force exerted by the further layer stack, wherein the further substrate has a further actual curvature deviating from the second setpoint curvature of the second mirror element prior to said forming of the further layer stack, wherein the second bending force exerted by the further layer stack is a least partly generated by performing a further post-treatment for changing a layer tension of the further layer stack, and wherein the first setpoint curvature differs from the second setpoint curvature.

9. The method as claimed in claim 8, wherein the first setpoint curvature differs from the second setpoint curvature due to mutually differing thicknesses of the first layer stack and of the further layer stack, even though the first bending force equals the second bending force.

10. The method as claimed in claim 8, wherein the first setpoint curvature differs from the second setpoint curvature, even though the first layer stack and the second layer stack have mutually same thicknesses, due to the first bending force differing from the second bending force.

* * * * *